US009093956B2

(12) United States Patent
Theodoratos et al.

(10) Patent No.: US 9,093,956 B2
(45) Date of Patent: Jul. 28, 2015

(54) VARIABLE DUTY-CYCLE MULTI-STANDARD MIXER

(75) Inventors: Gerasimos Theodoratos, Zografou (GR); Konstantinos Vryssas, Athens (GQ); Hamed Peyravi, Athens (GR); Kostis Vavelidis, Ilioupolis (GR)

(73) Assignee: Broadcom Corporation, Irvine, CA (US)

( * ) Notice: Subject to any disclaimer, the term of this patent is extended or adjusted under 35 U.S.C. 154(b) by 73 days.

(21) Appl. No.: 13/435,763

(22) Filed: Mar. 30, 2012

(65) Prior Publication Data

US 2013/0115907 A1    May 9, 2013

Related U.S. Application Data

(60) Provisional application No. 61/556,094, filed on Nov. 4, 2011.

(30) Foreign Application Priority Data

Mar. 20, 2012 (GR) .............................. 20120100167

(51) Int. Cl.
*H04B 1/26* (2006.01)
*H03D 7/14* (2006.01)
*H03D 7/16* (2006.01)

(52) U.S. Cl.
CPC ........... *H03D 7/1441* (2013.01); *H03D 7/1458* (2013.01); *H03D 7/1466* (2013.01); *H03D 7/165* (2013.01)

(58) Field of Classification Search
USPC ......... 455/313, 314, 317, 318, 324, 326, 330, 455/333, 334
See application file for complete search history.

(56) References Cited

U.S. PATENT DOCUMENTS

| 6,967,471 | B2 * | 11/2005 | Paulos | 323/282 |
| 7,392,026 | B2 * | 6/2008 | Alam et al. | 455/313 |
| 8,467,762 | B2 * | 6/2013 | Kokatsu | 455/313 |
| 2012/0052831 | A1 * | 3/2012 | Kokatsu | 455/313 |

* cited by examiner

*Primary Examiner* — Thanh Le
(74) *Attorney, Agent, or Firm* — Sterne, Kessler, Goldstein & Fox PLLC

(57) ABSTRACT

An adjustable mixer is disclosed that is capable of operating in different modes in order to satisfy the mixing requirement of multiple radio access technologies (RATs). The adjustable mixer includes a LO signal generating portion and a mixing portion. Depending on the mixing requirements of the RAT, the adjustable mixer can operate in any one of multiple modes, each mode having a specific configuration for the LO signal generating portion and the mixing portion. The LO signal generating portion generates a LO signal having a particular duty cycle, depending on the selected mode, for use by the mixing portion. The mixing portion has an adjustable circuit configuration that can be dynamically reconfigured based on the selected mode, and which allows the mixing portion to successfully mix received signals using the corresponding LO signals generated by the LO signal generating portion.

20 Claims, 7 Drawing Sheets

50% DUTY CYCLE LO SIGNALS

25% DUTY CYCLE LO SIGNALS

VARIABLE DUTY-CYCLE MULTI-STANDARD MIXER

CROSS-REFERENCE TO RELATED APPLICATIONS

This patent application claims the benefit of U.S. Provisional Patent Application No. 61/556,094, filed Nov. 4, 2011, entitled "Long Term Evolution Radio Frequency Integrated Circuit," which is incorporated herein by reference in its entirety.

BACKGROUND

1. Field of Invention

The invention relates to wireless communications, and more specifically to a variable duty cycle mixer module that is configured to select one of multiple duty cycles for the local oscillator depending on the performance of the mixer with respect to one or more radio access technologies.

2. Related Art

Wireless communication devices, such as cellular telephones to provide an example, are becoming commonplace in both personal and commercial settings. The wireless communication devices provide users with access to all kinds of information, as well as the ability to communicate with other such devices across large distances. For example, a user can access the internet through an interne browser on the device, download miniature applications (e.g., "apps") from a digital marketplace, send and receive emails, or make telephone calls using a voice over internet protocol (VoIP). Consequently, wireless communication devices provide users with significant mobility, while allowing them to remain "connected" to communication channels and information.

Wireless communication devices communicate with one or more other wireless communication devices or wireless access points to send and receive data. Typically, a first wireless communication device generates and transmits a radio frequency signal modulated with encoded information. This radio frequency signal is transmitted into a wireless environment and is received by a second wireless communication device. The second wireless communication device demodulates and decodes the received signal to obtain the information. The second wireless communication device may then respond in a similar manner. The wireless communication devices can communicate with each other or with access points using any well-known modulation scheme, including simple amplitude modulation (AM), simple frequency modulation (FM), quadrature amplitude modulation (QAM), phase shift keying (PSK), quadrature phase shift keying (QPSK), and/or orthogonal frequency-division multiplexing (OFDM), as well as any other communication scheme that is now, or will be, known.

During communication, signals received by the wireless communication device are provided to a mixer, which is generally employed to shift the frequency of the received signals. This can be used, for example, to shift a modulated signal to a baseband frequency.

In non-linear systems, including mixers, the second order intercept point (IP2) is a measure of linearity that quantifies the second-order distortion generated by nonlinear systems and devices. In a wireless transceiver, any leakage from the transmitter into the receiver chain, can exacerbate second order distortion because of the relatively high amplitude level of the transmit signal. As such, improving IP2 of the receiver chain has become imperative in modern communication standards.

Therefore, the standards of most modern RATs (radio access technologies) define strict IP2 levels that must be achieved by mixers that are used with those RATs. For example, the 2G wireless standard (incorporated herein by reference in its entirety) requires approximately 40 dB of IP2 level, the 3G specification (incorporated herein by reference in its entirety) requires approximately 45 dB of IP2 level, and the 4G specification (incorporated herein by reference in its entirety) requires approximately 52 dB of IP2 level.

Because of manufacturing variables, different mixers produce different IP2 performance. However, because any of 2G, 3G and 4G modes share the same RF frequency range, it would be beneficial to employ only a single mixer for receiving signals within each such RAT.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1:
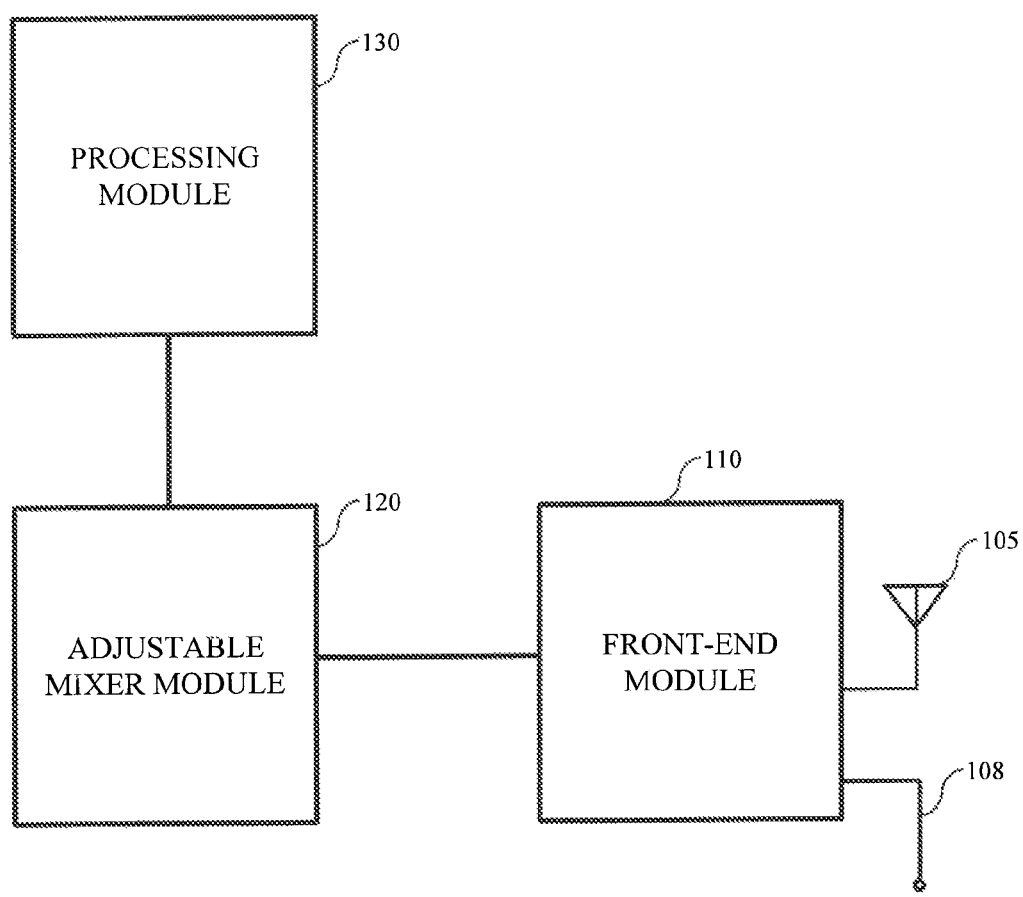
FIG. 1 illustrates a block diagram of an adjustable mixer module setting environment 100 according to an exemplary embodiment.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the disclosure. Further, the scope of the invention is defined only in accordance with the following claims and their equivalents.

Embodiments of the disclosure may be implemented in hardware (e.g., circuits), firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc.

For purposes of this discussion, the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Although the description of the present disclosure is to be described in terms of wireless communication (specifically cellular communication), those skilled in the relevant art(s) will recognize that the present disclosure may be applicable to other communications that use wired or other wireless communication methods without departing from the spirit and scope of the present disclosure.

An Exemplary Adjustable Mixer Module Setting Environment

FIG. 1 illustrates an adjustable mixer module setting environment 100 according to an exemplary embodiment. The adjustable mixer module setting environment 100 includes an adjustable mixer module 120.

The adjustable mixer module setting environment 100 may represent a testing apparatus configured to test and set the adjustable mixer module 120 during a testing stage. The adjustable mixer module setting environment 100 is configured to send or receive signals via an antenna 105 connected to a front-end module 110. The front-end module 110 may perform one or more functions relating to transmitting or receiving wireless signals, and may include amplifiers (e.g. low noise amplifiers), filters, etc. for pre-processing the signal prior to down-conversion by the adjustable mixer module 120. Alternatively, or in addition to the antenna 105, the adjustable mixer module setting environment may be configured to send or receive test signals via a test connection 108, which allows test signals to be directly input to the front-end module 110 over a wired connection. In an embodiment, the test connection 108 is integrated with the antenna 105, so that the radiating element of the antenna 105 is removable and the test connection 108 is then available for access.

A processing module 130 performs various backend processes, such as deciphering received signals, setting the adjustable mixer module 120, and performing general device control operations, etc.

Upon receipt of signals from a wireless communication environment, the front-end module 110 forwards the received signals to the adjustable mixer module 120. The adjustable mixer module 120 mixes the received signals using local oscillator (LO) signals and forwards the resulting mixed signals to the processing module for analysis. For example, the mixed signals may be down-converted to baseband or an intermediate frequency by the adjustable mixer module 120.

The LO signals are preferably differential LO signals having a maximum 50% duty cycle. It has been determined that a 50% duty cycle gives the mixer basic IP2 levels that may vary among similarly-manufactured mixers. For example, a 50% duty cycle employed by one mixer may provide better IP2 levels than a 50% duty cycle employed by a second mixer. It has also been determined that a 25% duty cycle provides an improved IP2 levels, at the cost of increased power consumption.

The different duty cycles have many additional characteristics, which may be used for setting the adjustable mixer module. For example, a 50% duty cycle LO signal has good LO phase noise characteristics and also consumes less power (because no conversion is required, as discussed below). 25% duty cycle LO signals, on the other hand, produce higher gain, IQ isolation, better noise figure, and enhanced IP2 performance than the 50% duty cycle. In addition, a 12.5% duty cycle appears to provide enhanced image and harmonic rejection over both the 50% and 25% duty cycles. Additional duty cycles with additional characteristics may also be available. For purposes of this discussion, the adjustable mixer module 120 will be described with respect to the 25% and 50% duty cycle LO signals.

Because the 50% duty cycle has the lowest power consumption, the adjustable mixer module 120 preferably initially mixes received signals using the 50% duty cycle. The mixed signals thus generated are analyzed by the processing module 130, particularly with respect to their IP2 levels. The processing module 130 may measure the IP2 levels of the signal using any method that is now, or will be known, and compares the result to a predetermined threshold. The predetermined threshold may be set equal to the IP2 performance requirement associated with any of the RATs (preferably equal to the largest requirement among all RATs on which the device may communicate).

If the processing module 130 determines that the IP2 levels of the mixed signal are sufficient, the processing module 130 sets the adjustable mixer module 120 accordingly (discussed below). Alternatively, if the processing module 130 determines that the IP2 levels of the mixed signal are insufficient, the processing module 130 sets the adjustable mixer module 120 to operate at the next-lowest duty cycle (discussed below) and again tests mixed signals. This process repeats until a suitable duty cycle has been discovered to satisfy the IP2 requirements of all desired RATs that may be currently used, or used in the future.

Those skilled in the relevant art(s) will recognize that many modifications may be made to the adjustable mixer module setting environment 100 within the spirit and scope of the present disclosure. For example, the processing module 130 may be employed primarily to perform testing operations of the mixed signals, whereas setting of the adjustable mixer module 120 can be controlled by an external device. In addition, the processing module 130 need not set the adjustable mixer module 120 based only on IP2. Instead, the processing module 130 may set the adjustable mixer module 120 based on any parameter, including power consumption, gain, IQ isolation, as well as any other parameter that may be directly or indirectly affected by mixer performance, or any combination thereof.

An Exemplary Adjustable Mixer Module

Figure 2:
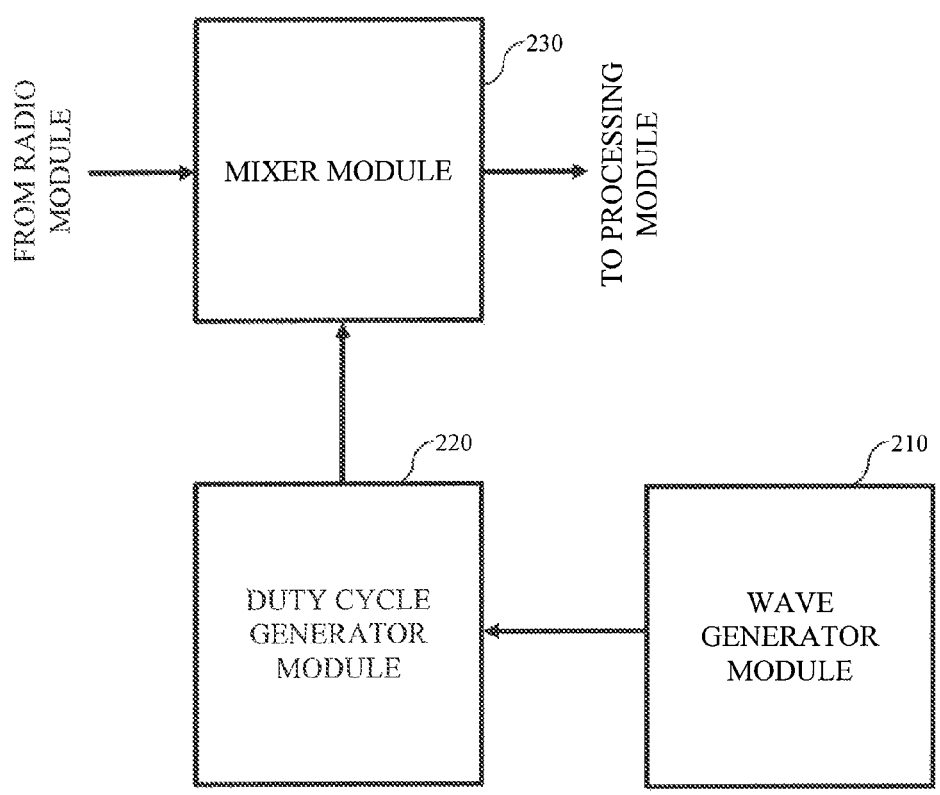
FIG. 2 illustrates a block diagram of an adjustable mixer module according to an exemplary embodiment.

FIG. 2 illustrates a block diagram of an adjustable mixer module 200 according to an exemplary embodiment. The adjustable mixer module 200 includes a duty cycle generator module 220 and a mixer module 230, and may represent an exemplary embodiment of the adjustable mixer module 120.

The adjustable mixer module 200 includes a wave generator 210 to generate one or more base LO signal. Preferably the wave generator 210 generates a differential pair of 50% duty cycle LO signals. However, the wave generator 210 may alternatively generate only a single 50% duty cycle LO signal or any other duty cycle LO signal within the spirit and scope of the present disclosure. The wave generator 210 forwards the generated LO signals to the duty cycle generator module 220.

As discussed above, the adjustable mixer module 200 has previously been set to a particular duty cycle (either as an initializing step or corresponding with its IP2 performance). Upon receiving the base LO signals from the wave generator module 210, the duty cycle generator module 220 generates LO signals having the designated duty cycle, and forwards the resulting LO signals to the mixer module 230.

The mixer module 230 receives signals from the front-end module 110. The mixer module 230 mixes the received signals based on the LO signals received from the duty cycle generator module 220. The mixer module 230 then forwards the mixed signals to the processing module 130 for analysis.

Figure 3:
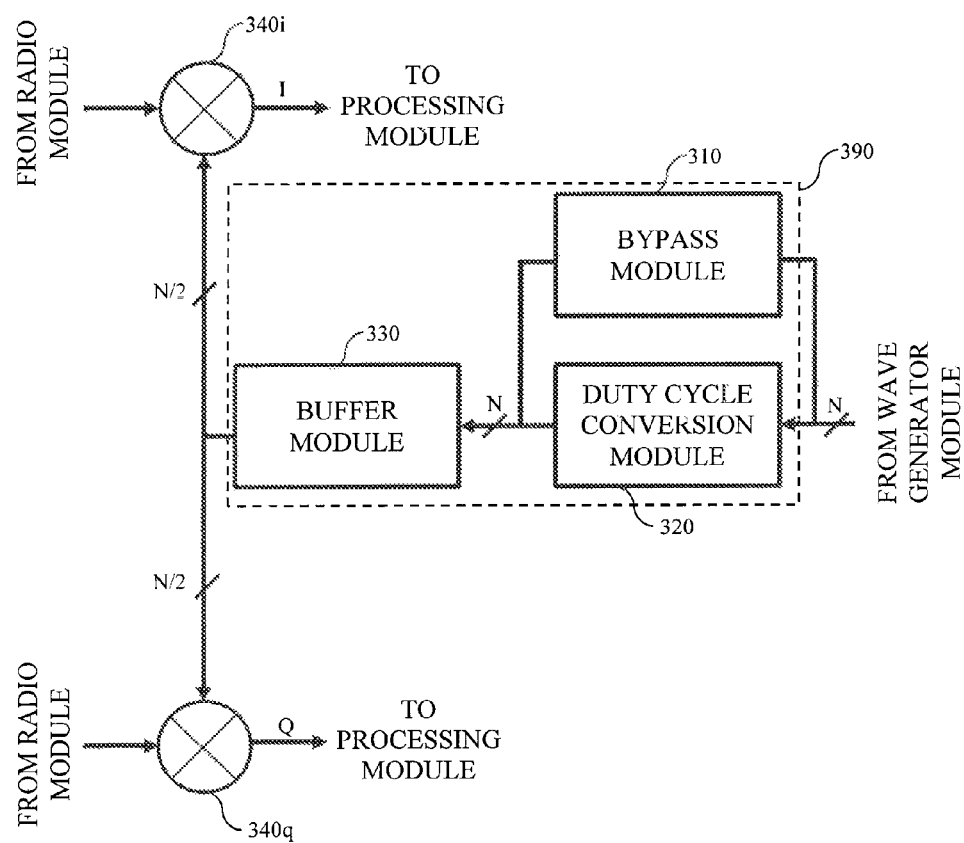
FIG. 3 illustrates a block diagram of a mixer module and a duty cycle generator module according to an exemplary embodiment.

FIG. 3 illustrates a block diagram of a mixer module 340 and a duty cycle generator module 390 according to an exemplary embodiment. The mixer module 340 includes an I-mixer 340$i$ and a Q-mixer 340$q$, and may represent an exemplary embodiment of the mixer module 230. The duty cycle generator module 390 includes a duty cycle conversion module 320 and a bypass module 310, and may represent an exemplary embodiment of the duty cycle generator module 220.

The duty cycle generator module 390 receives N base LO signals from the wave generator module, where N is a positive integer. For purposes of this discussion, it will be presumed that the wave generator module 210 provides N=4 base LO signals to the duty cycle generator corresponding to a pair of I-differential LO signals and a pair of Q-differential LO signals that each have a 50% duty cycle.

Depending on the duty cycle set for the mixer module 340, the duty cycle generator module 390 causes the received base LO signals to pass through either a bypass module 310 or a duty cycle conversion module 320. Specifically, if the mixer module 340 is set to a 50% duty cycle operation, then the received base LO signals do not need converting because they already have the desired duty cycle. Consequently, the duty cycle generator module 390 causes the received LO signals to bypass the duty cycle conversion module 320 via the bypass module 310.

The bypass module 310 may constitute any suitable device or component for causing the base LO signals to bypass the duty cycle conversion module 320. For example, the bypass module 310 may be implemented by a switch, and the duty cycle generation module 390 may cause the base LO signals to bypass the duty cycle conversion module 320 by closing the switch.

If, on the other hand, the mixer module 340 is currently set to operate at a duty cycle other than the duty cycle of the base LO signals supplied by the wave generator module 210, the duty cycle generation module 390 causes the base LO signals to pass through the duty cycle conversion module 320 (e.g., by opening the switch of the bypass module 310). The duty cycle conversion module 320 then converts the base LO signals to have the desired duty cycle to generate LO signals that are to be used by the mixers 340$i$ and 340$q$. The signals then pass to the buffer module 330.

Duly Cycle Conversion

Figure 4:
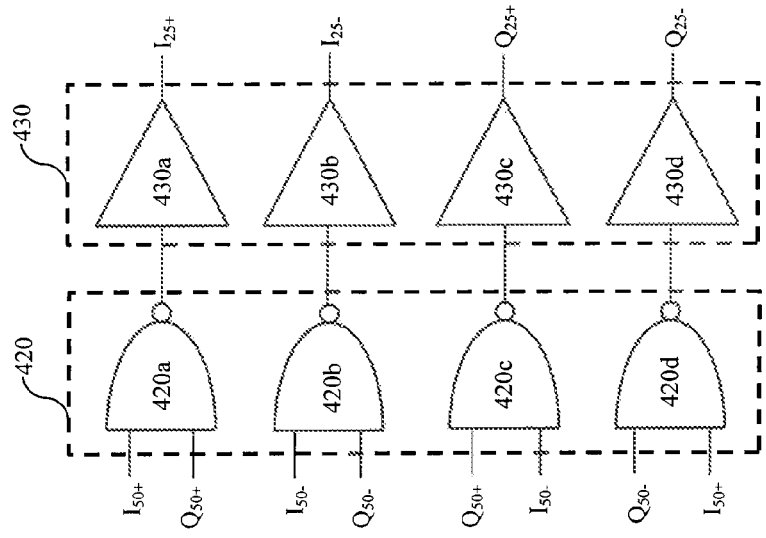
FIG. 4 illustrates a block diagram of a duty cycle conversion module according to an exemplary embodiment.
Figure 4:
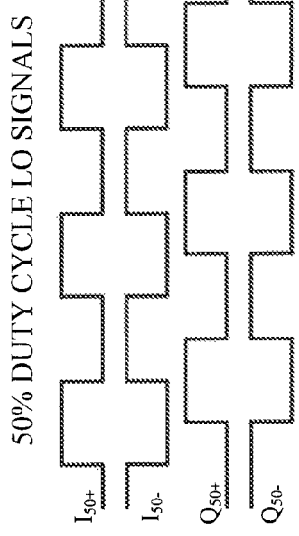
Figure 4:
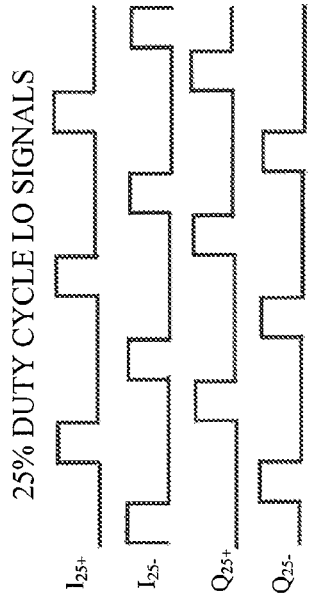

FIG. 4 illustrates a block diagram of a duty cycle conversion module 420 that may represent an exemplary embodiment of the duty cycle conversion module 320, and a buffer module 430 that may represent an exemplary embodiment of the buffer module 330.

As shown in FIG. 4, the wave generator module supplies quadrature/in-phase base LO signals to the duty cycle conversion module 420. In particular, the base LO signals include a pair of 50% duty cycle differential LO I-signals: $I_{50+}$ and $I_{50-}$, and a pair of 50% duty cycle differential LO Q-signals: $Q_{50+}$ and $Q_{50-}$. As shown, the LO Q-signals are phase shifted by 90 degrees, relative to the LO I-signals.

The duty cycle conversion module 420 includes a plurality of NAND gates 420$a$-420$d$, each of which receives an I/Q pair of base LO signals. After the duty cycle conversion module 420, LO signals resulting from the NAND operations are forwarded to corresponding buffers 430$a$-430$d$ within the buffer module 430. Because the Q-signals are 90° out of alignment with the I-signals, the signals output by the buffers 430$a$-430$d$ are 25% duty cycle signals, due to the NAND operations. As shown in FIG. 4, the 25% duty cycle LO signals include a pair of differential LO I-signals: $I_{25+}$ and $I_{25-}$, and a pair of differential LO Q-signals: $Q_{25+}$ and $Q_{25-}$. Accordingly, by passing the generated 50% duty cycle base LO signals through the duty cycle conversion module 420, 25% duty cycle LO signals can be generated to provide different performance to the mixer module.

Returning to FIG. 3, after the LO signals pass through the buffer module 330, the LO Q-signals ($Q_{50+}$ and $Q_{50-}$, or $Q_{25+}$ and $Q_{25-}$, depending on the set duty cycle) are forwarded to the Q-mixer 340$q$ and the LO I-signals ($I_{50+}$ and $I_{50-}$, or $I_{25+}$ and $I_{25-}$, depending on the set duty cycle) are forwarded to the I-mixer 340$i$ for controlling the mixing functionality of the corresponding mixers.

Adjusting Mixer Module

Figure 5:
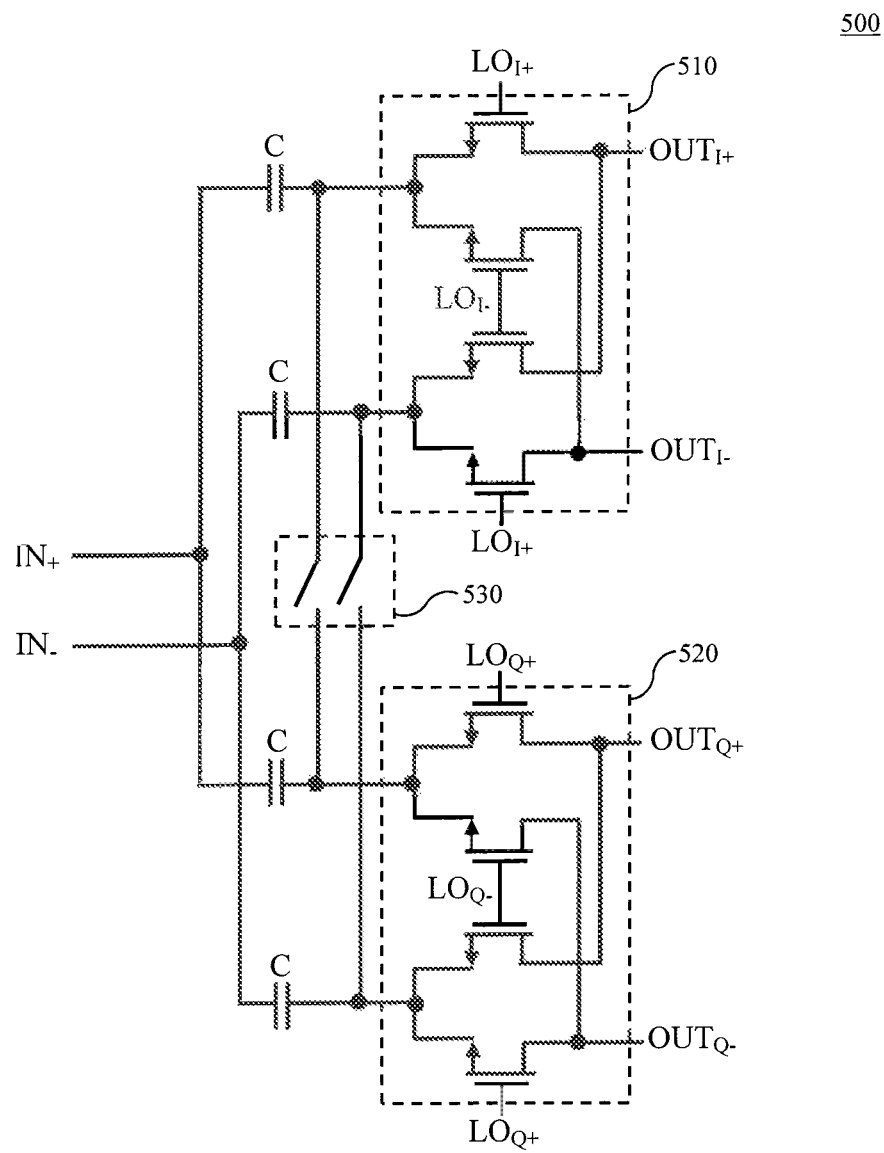
FIG. 5 illustrates a block diagram of an adjustable mixer circuit of an adjustable mixer module according to an exemplary embodiment.

FIG. 5 illustrates a circuit diagram of a mixer module 500 according to an exemplary embodiment. The mixer module 500 includes an I-mixer 510 that may represent an exemplary embodiment of the I-mixer 340$i$, and a Q-mixer 520 that may represent an exemplary embodiment of the Q-mixer 340$q$. The mixer module 500 also includes a switching module 530, and may represent an exemplary embodiment of the mixer module 230.

The mixer module 500 receives a pair of differential input signals $IN_+$ and $IN_-$ from the front-end module 110. The differential input signals $IN_+$ and $IN_-$ are sent to both the I-mixer 510 and the Q-mixer 520 via capacitors C that are preferably equal to, or nearly equal to, each other in capacitance.

The I-mixer 510 receives the differential input signals and mixes the signals by passing them through a transistor circuit having a plurality of transistors. Each of the transistors of the I-mixer 510 is controlled by one of either a positive signal $LO_{I+}$ or a negative signal $LO_{I-}$ of a differential signal LO. Specifically, these components of the differential signal LO are applied and control the gates of their corresponding transistors so as to switch the transistors on and off according to the frequency and duty cycle of the corresponding LO signal. $LO_{I+}$ may be one of either $I_{50+}$ or $I_{25+}$ and $LO_{I-}$ may be one of either $I_{50-}$ or $I_{25-}$, depending on whether the mixer module 500 operates in 50% duty cycle mode or 25% duty cycle mode. The I-mixer 510 outputs differential in-phase signals $OUT_{I+}$ and $OUT_{I-}$ as the final mixed signals.

The Q-mixer 520 operates substantially the same as the I-mixer 510. Specifically, the Q-mixer 520 receives the differential input signals and mixes the signals by passing them through another transistor circuit having a plurality of transistors. Each of the transistors of the Q-mixer 520 is controlled by one of either a positive signal $LO_{Q+}$ or a negative signal $LO_{Q-}$ of the differential signal LO. Specifically, these components of the differential signal LO are applied and control the gates of their corresponding transistors so as to switch the transistors on and off according to the frequency and duty cycle of the corresponding LO signal. $LO_{Q+}$ may be one of either $Q_{50+}$ or $Q_{25+}$ and $LO_{Q-}$ may be one of either $Q_{50-}$ or $Q_{25-}$, depending on whether the mixer module 500 operates in 50% duty cycle mode or 25% duty cycle mode. The Q-mixer 520 outputs differential quadrature signals $OUT_{Q+}$ and $OUT_{Q-}$ as the final mixed signals.

As discussed above, as part of setting the mixer module 500 to one of either 50% duty cycle mode or 25% duty cycle mode, the mixer module 500 is supplied with the proper LO signals $LO_{I+}$, $LO_{I-}$, $LO_{Q+}$ and $LO_{Q-}$. In addition, the switching module 530 must be set in order to configure the hardware of the mixer module 500. The switching module 530 may be any device or component capable of connecting and disconnecting the outputs of the capacitors at the positive input to each other, and connecting and disconnecting the outputs of the capacitors at the negative input to each other. For simplicity and ease of manufacturing, the switching module preferably comprises a pair of switches.

For the 50% duty cycle mode, the switching module 530 remains open, breaking the connection between the I-mixer inputs and the Q-mixer inputs. For the 25% duty cycle, on the other hand, the switching module 530 is closed, thereby short-circuiting the positive input of the I-mixer 510 with the positive input of the Q-mixer 520, and short-circuiting the negative input of the I-mixer 510 with the negative input of the Q-mixer 520. In this manner, the mixer module 500 can be set to either the 50% or 25% duty cycle mode.

Those skilled in the relevant art(s) will recognize that many modifications may be available for the adjustable mixer module. For example, the mixer module 230 may be modified to also be adjustable for additional duty cycles, such as 75% or 12.5%, among others. Specifically, the wave generator module 210 may be modified to output a differential pair of 50% duty cycle LO signals with twice the frequency of the signals described above to allow for the generation of 12.5% duty cycle, and/or the mixer module 230 may include a plurality of inverters for generating 75% duty cycles. With similar modifications, the duty cycle generator 220 may generate several additional duty cycle LO signals. The duty cycle conversion module 320 may have any configuration that allows it to generate desired duty cycle LO signals from one or more base LO signals. The mixer module 500 may also be further modified in accordance with similar principles in order to operate on those additional LO signals.

An Exemplary Wireless Communication Device

Figure 6:
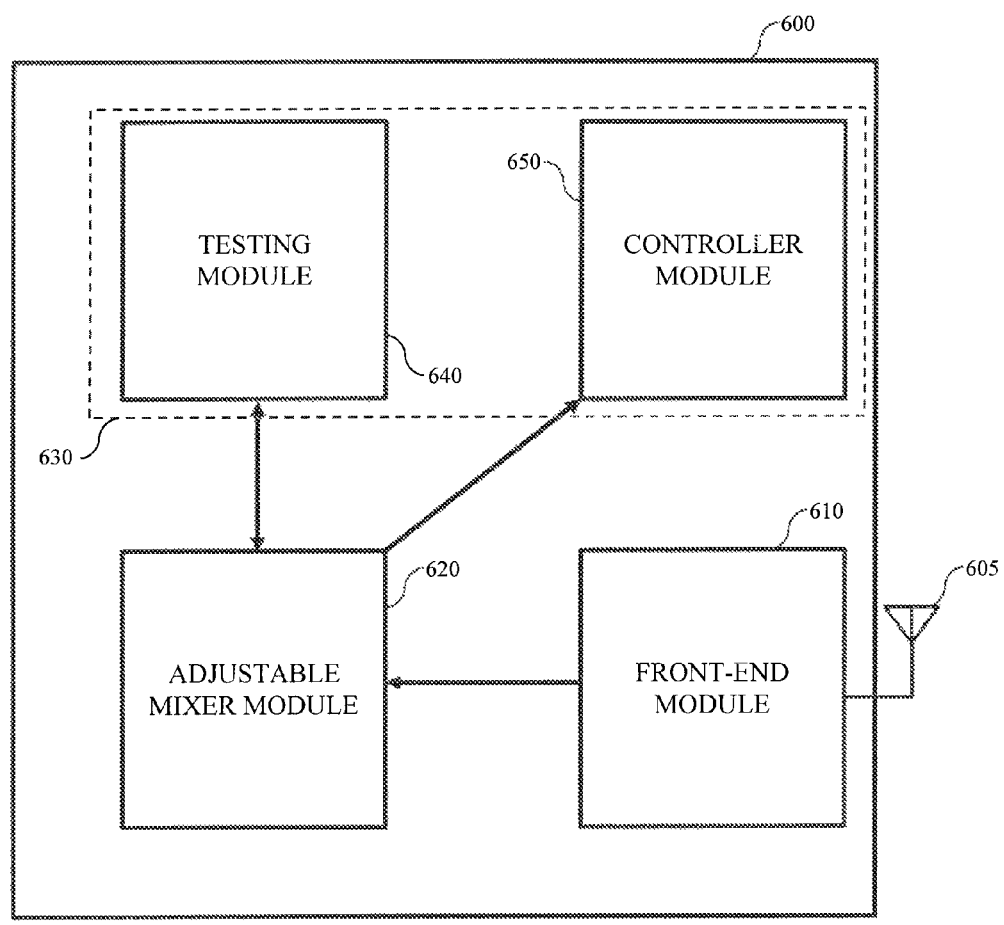
FIG. 6 illustrates a block diagram of a wireless communication device according to an exemplary embodiment.

FIG. 6 illustrates a block diagram of a wireless communication device 600 according to an exemplary embodiment. The wireless communication device 600 includes an adjustable mixer module 620 that may represent an exemplary embodiment of the adjustable mixer module 120.

As discussed above, because of the calculation involved, the mixer module will likely be tested and set at a manufacturing level, prior to its use within a wireless communication device, such as a cellular phone, tablet, etc. However, it is conceivable that such an adjustable mixer module 620 may be included in a wireless communication device 600, and configured to be set and reset during use and/or in real-time.

As shown in FIG. 6, the adjustable mixer module 620 is connected to the front-end module 610, which sends or receives signals via an antenna 605. For purposes of this discussion, the front-end module 610 receives signals. Received signals are sent to the adjustable mixer module 620 for down-conversion by mixing with the LO signal. The adjustable mixer module 620 sends the mixed signals to both a controller module 650 and a testing module 640. The controller module 650 performs additional background processing on the received signals. The testing module 640 and the controller module 650 may together constitute a processing module 630.

The testing module 640 measures the IP2 performance of the adjustable mixer module 620 with respect to the mixed signals. Based on the results of the test, the testing module 640 is able to determine whether the adjustable mixer module 620 should operate in a 50% duty cycle mode or a 25% duty cycle mode, and may adjust the adjustable mixer module accordingly. Such testing may occur with a set frequency or after some condition has been satisfied (e.g., only following a change from one RAT to another).

In an example, if the testing module 640 discovers that the wireless communication device 600 is communicating using 2G, the testing module 640 may initiate the test of the adjustable mixer module 620. The adjustable mixer module 620 may currently be operating in 25% duty cycle, which the testing module 640 determines to be unnecessary. If the IP2 test reveals that the current mode is over-sufficient for the 2G communications, in order to save power, the testing module 640 sets the adjustable mixer module 620 to instead operate in 50% duty cycle mode. Similar operations can be performed for other scenarios to adjust the adjustable mixer module 620 as needed.

By dynamically switching the adjustable mixer module 620, the wireless communication device 600 can be optimized for both performance and power-saving.

In the wireless communication device 600, the adjustable mixer module 620 operates substantially as discussed above with respect to the adjustable mixer module 120, and can include any and all of the functionality and configurations thereof, among others that are within the spirit and scope of the present disclosure.

Those skilled in the relevant art(s) will recognize that many modifications may be available for the wireless communication device 600. For example, the adjustable mixer module 620 may be set to different mixing modes based on known information, such as the response of the adjustable mixer module 620 to a particular RAT. Consequently, the adjustable mixer module 620 may be set to operate in a particular mixing mode depending solely on the current RAT used by the wireless communication device. The current RAT may also be used in addition to one or more other parameters for determining the mixing mode.

An Exemplary Method for Adjusting a Mixer

Figure 7:
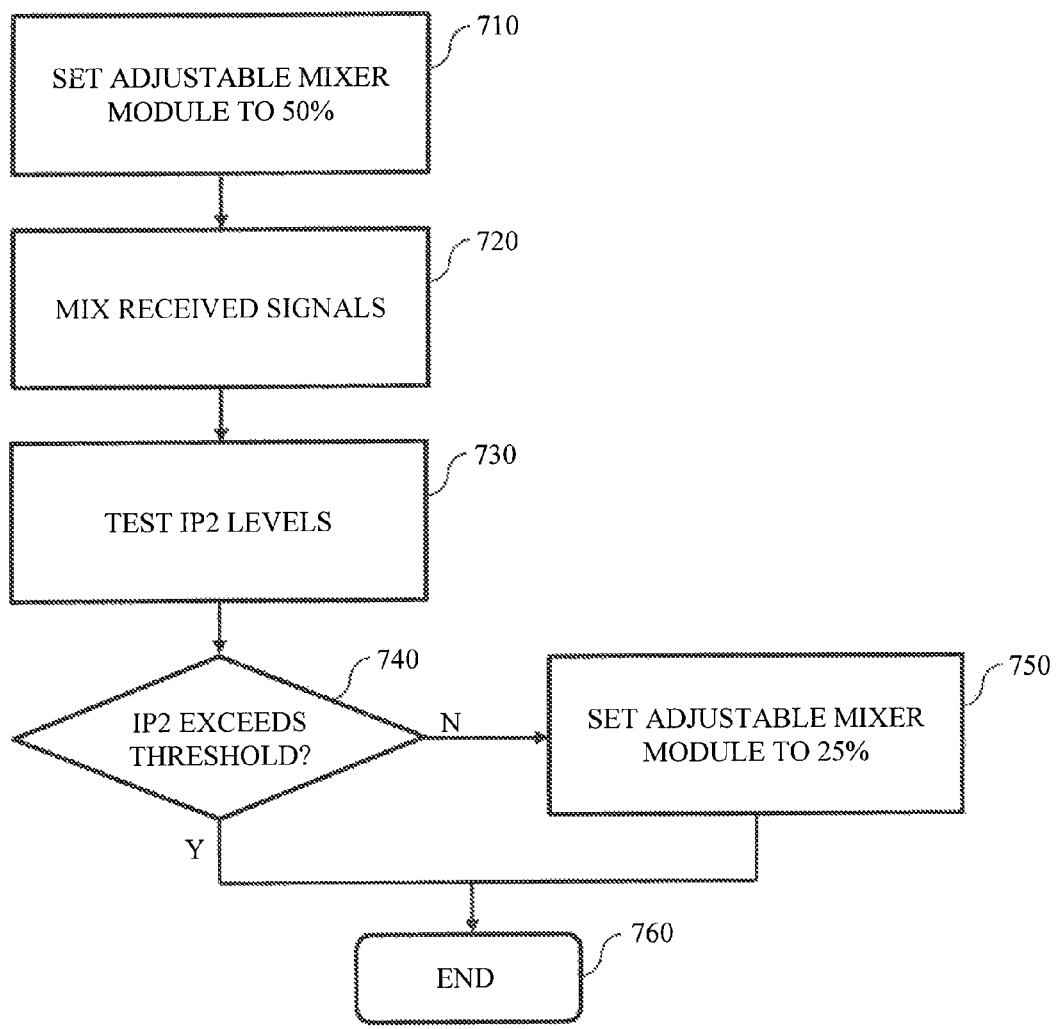
FIG. 7 illustrates a block diagram of a method for adjusting an adjustable mixer according to an exemplary embodiment.

FIG. 7 illustrates a block diagram of a method for setting an adjustable mixer module according to an exemplary embodiment.

The adjustable mixer module is initially set to a 50% duty cycle mode (710). Using the 50% duty cycle mode, the adjustable mixer module mixes received signals (720) and then tests their IP2 levels (730).

Based on the test, it is determined whether the IP2 performance of the 50% duty cycle is sufficient (740). This may be determined by comparing the IP2 performance of the 50% duty cycle to a predetermined threshold, which may be set based on the IP2 requirements of a RAT on which the adjustable mixer is expected to operate. If the IP2 performance exceeds the threshold (Y in 740), the adjustable mixer module remains set to the 50% duty cycle, and the method ends (760).

Alternatively, if the IP2 performance does not exceed the threshold (N in 740), the adjustable mixer module is set to a 25% duty cycle (750). This may be accomplished by turning off a bypass module within the duty cycle generator module so as to cause the 50% LO signals to enter a duty cycle conversion module and by turning on a switching module within the mixer to short-circuit the positive input of a Q-mixer to the positive input of an I-mixer and short-circuit the negative input of the Q-mixer to the negative input of the I-mixer. Once set to the 25% mode, the method ends (760).

Those skilled in the relevant art(s) will recognize that the method described above with respect to FIG. 7 can additionally or alternatively include any of the functionality of the adjustable mixer module setting environment 100 and/or the wireless communication device 600 discussed above, and the above description of the exemplary method should neither be construed to limit the method nor the description of the adjustable mixer module setting environment 100 or the wireless communication device 200.

CONCLUSION

It is to be appreciated that the Detailed Description, and not the Abstract, is intended to be used to interpret the claims. The Abstract section may set forth one or more, but not all exemplary embodiments, of the invention, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A mixer, comprising:
   a mixer module configured to mix an input signal in accordance with one of a first mixing mode or a second mixing mode;
   a duty cycle generator module configured to supply a first local oscillator (LO) signal having a base duty cycle to the mixer module when the mixer module operates in the first mixing mode, or supply a second LO signal having a second duty cycle when the mixer module operates in the second mixing mode, wherein the second duty cycle is different from the base duty cycle; and
   a processing module configured to measure a parameter associated with the mixer, and select the first mixing mode or the second mixing mode based on the measured parameter.

2. The mixer of claim 1, wherein the duty cycle generator module is configured to receive a base LO signal having the base duty cycle, and to generate the first LO signal or the second LO signal from the base LO signal.

3. The mixer of claim 2, wherein the duty cycle generator module includes a duty cycle conversion module,
   wherein the duty cycle generator module is configured to generate the second LO signal by passing the base LO signal through the duty cycle conversion module, and
   wherein the duty cycle generator module is configured to generate the first LO signal by causing the base LO signal to bypass the duty cycle conversion module.

4. The mixer of claim 1, wherein a frequency of the first LO signal is substantially the same as a frequency of the second LO signal.

5. The mixer of claim 1, wherein the first LO signal has a first period and the second LO signal has a second period,
   wherein the first LO signal is active for a first percentage of the first period and the second LO signal is active for a second percentage of the second period, and
   wherein the first percentage is greater than the second percentage.

6. The mixer of claim 1, wherein the mixer module includes:
   a first mixer portion having a first terminal and a second terminal;
   a second mixer portion having a third terminal and a fourth terminal; and
   a switching module configured to connect or disconnect the first terminal with the third terminal and the second terminal with the fourth terminal based on whether the processing module selects the first mixing mode or the second mixing mode.

7. The mixer of claim 1, wherein the parameter is an IP2 characteristic of an output of the mixer.

8. The mixer of claim 1, wherein the processor module is further configured to compare the measured parameter to a predetermined threshold, and control the duty cycle generator module to provide the first LO signal or the second LO signal based on the comparison.

9. A mixer, comprising:
a mixer module configured to mix an input signal in accordance with one of a first mixing mode or a second mixing mode, the mixer module including:
an I-mixer configured to mix an in-phase signal portion of an in-phase/quadrature input signal, the I-mixer having a positive input terminal and a negative input terminal,
a Q-mixer configured to mix a quadrature signal portion of the in-phase/quadrature input signal, the Q-mixer having a positive input terminal and a negative input terminal, and
a switching module configured to connect or disconnect the positive input terminal of the I-mixer to the positive input terminal of the Q-mixer, and the negative input terminal of the I-mixer to the negative input terminal of the Q-mixer; and
a duty cycle generator module configured to supply a first local oscillator (LO) signal having a base duty cycle to the mixer module when the mixer module operates in the first mixing mode, or supply a second LO signal having a second duty cycle when the mixer module operates in the second mixing mode, wherein the second duty cycle is different from the base duty cycle.

10. The mixer of claim 9, wherein the switching module is configured to set the mixer module to operate in the first mixing mode or the second mixing mode.

11. A mixer, comprising:
a mixer module configured to mix an input signal in accordance with one of a first mixing mode or a second mixing mode; and
a duty cycle generator module configured to supply a first local oscillator (LO) signal to the mixer module when the mixer module operates in the first mixing mode, or supply a second LO signal when the mixer module operates in the second mixing mode;
wherein the duty cycle generator module is configured to receive a base LO signal having a base duty cycle, and to generate the first LO signal or the second LO signal from the base LO signal,
wherein the base LO signal includes an in-phase portion and a quadrature portion, and
wherein the duty cycle generator module includes a NAND gate that operates on the in-phase portion and the quadrature portion of the base LO signal in order to generate the second LO signal.

12. A mixer, comprising:
a mixer module configured to mix an input signal with a local oscillator (LO) signal in accordance with one of a first mixing mode or a second mixing mode; and
a duty cycle generator module configured to generate the LO signal to have a first duty cycle during the first mixing mode, or generate the LO signal to have a second duty cycle during the second mixing mode, wherein the second duty cycle is different from the first duty cycle;
wherein the first mixing mode supports wireless communications according to a first radio access technology (RAT), and the second mixing mode supports wireless communications according to a second RAT.

13. The mixer of claim 12, wherein a frequency of the LO signal is unchanged for both the first duty cycle and the second duty cycle.

14. The mixer of claim 12, wherein a period of the LO signal is unchanged for both the first duty cycle and the second duty cycle.

15. The mixer of claim 12, wherein the LO signal has a period,
wherein the LO signal is active for a first percentage of the period for the first duty cycle, and for a second percentage of the period for the second duty cycle, and
wherein the first percentage is greater than the second percentage.

16. A mixer, comprising:
a first mixer portion configured to mix a first portion of an input signal, the first mixer portion including a first input terminal and a second input terminal;
a second mixer portion configured to mix a second portion of an input signal, the second mixer portion including a first input terminal and a second input terminal;
a switching module configured to switch between a first mixing mode and a second mixing mode,
wherein, in the first mixing mode, the first input terminal of the first mixer portion is connected with the first input terminal of the second mixer portion, and the second input terminal of the first mixer portion is connected with the second input terminal of the second mixer portion, and
wherein, in the second mixing mode, the first input terminal of the first mixer portion is disconnected with the first input terminal of the second mixer portion, and the second input terminal of the first mixer portion is disconnected with the second input terminal of the second mixer portion.

17. The mixer of claim 16, further comprising a duty cycle generator module configured to supply a first local oscillator (LO) signal to the mixer module during the first mixing mode, and configured to supply a second LO signal during the second mixing mode.

18. The mixer of claim 16, further comprising a processor module configured to analyze a parameter associated with the mixer, and to control the switching module based on the analysis.

19. The mixer of claim 18, wherein the analysis includes measuring the parameter and comparing the parameter to a predetermined threshold.

20. The mixer of claim 19, wherein the parameter is an IP2 characteristic of an output signal output from the mixer.

* * * * *